(12) United States Patent
Steele et al.

(10) Patent No.: US 10,793,296 B2
(45) Date of Patent: *Oct. 6, 2020

(54) DEPLOYABLE SOLAR ARRAY FOR SMALL SPACECRAFT

(71) Applicant: SolAero Technologies Corp., Albuquerque, NM (US)

(72) Inventors: Kenneth Loyd Steele, Carlsbad, CA (US); Theodore Garry Stern, El Cajon, CA (US)

(73) Assignee: SolAero Technologies Corp., Albuqueque, NM (US)

( * ) Notice: Subject to any disclaimer, the term of this patent is extended or adjusted under 35 U.S.C. 154(b) by 75 days.

This patent is subject to a terminal disclaimer.

(21) Appl. No.: 15/890,163

(22) Filed: Feb. 6, 2018

(65) Prior Publication Data

US 2018/0170583 A1    Jun. 21, 2018

Related U.S. Application Data

(63) Continuation of application No. 14/921,238, filed on Oct. 23, 2015, now Pat. No. 9,919,815.

(Continued)

(51) Int. Cl.
*B64G 1/44* (2006.01)
*H02S 30/20* (2014.01)
(Continued)

(52) U.S. Cl.
CPC ............. *B64G 1/443* (2013.01); *B64G 1/222* (2013.01); *B64G 1/44* (2013.01); *H01L 31/041* (2014.12);
(Continued)

(58) Field of Classification Search
CPC .. B64G 1/443; B64G 1/22; B64G 1/44; H01L 31/041; H02S 30/20; H02S 40/42;
(Continued)

(56) References Cited

U.S. PATENT DOCUMENTS 3,145,948 A    8/1964 Kershner
3,473,758 A    10/1969 Valentijn
(Continued)

FOREIGN PATENT DOCUMENTS

EP    2354006 A1    8/2011
EP    2471714 A1    7/2012

OTHER PUBLICATIONS

Clark, Craig, Huge Power Demand . . . Itsy-Bitsy Satellite, Solving the CubeSat Power Paradox in 24th Annual AIAA/USU Conference on Small Satellites (2010), obtained online from http://digitalcommons.usu.edu/cgi/viewcontent.cgi?article=1202&context=smallsat (last accessed on Sep. 30, 2016).

(Continued)

*Primary Examiner* — Theodore V Adamos

(57) ABSTRACT

The present disclosure provides, among other things, a deployable solar array comprising: an array of electromagnetic transducer devices such as photovoltaic devices; and a flexible, elongated, rectangular sheet for supporting the array of electromagnetic transducer devices composed of a composite laminate having a predetermined pattern of graphite fiber plies which impart a predefined tension in the planar surface of the sheet so that it curls into a planar sheet with a uniform radius of curvature along its major axis.

11 Claims, 4 Drawing Sheets

Related U.S. Application Data

(60) Provisional application No. 62/202,448, filed on Aug. 7, 2015, provisional application No. 62/068,501, filed on Oct. 24, 2014.

(51) Int. Cl.
   *H02S 40/42* (2014.01)
   *H02S 40/22* (2014.01)
   *B64G 1/22* (2006.01)
   *H01L 31/041* (2014.01)

(52) U.S. Cl.
   CPC ............ *H02S 30/20* (2014.12); *H02S 40/22* (2014.12); *H02S 40/42* (2014.12); *Y02E 10/52* (2013.01)

(58) Field of Classification Search
   CPC ... H02S 40/22; B65H 75/364; Y10S 136/292; Y02E 10/52
   USPC ............ 244/159.5, 172.6, 172.7, FOR. 112; 136/244, 245, 292
   See application file for complete search history.

(56) References Cited

U.S. PATENT DOCUMENTS

| | | | |
|---|---|---|---|
| 3,490,950 | A | 1/1970 | Myer |
| 3,690,080 | A | 9/1972 | Dillard |
| 3,733,758 | A | 5/1973 | Maier et al. |
| 3,735,943 | A | 5/1973 | Fayet |
| 3,778,312 | A | 12/1973 | Karius |
| 3,785,590 | A | 1/1974 | Wentworth |
| 4,282,394 | A | 8/1981 | Lackey et al. |
| 4,313,422 | A | 2/1982 | McEntee |
| 4,587,777 | A | 5/1986 | Brown et al. |
| 4,635,071 | A | 1/1987 | Gounder et al. |
| 4,636,579 | A | 1/1987 | Hanak et al. |
| 4,713,492 | A | 12/1987 | Hanak |
| 4,727,932 | A | 3/1988 | Mahefkey |
| 4,968,372 | A | 11/1990 | Maass |
| 5,131,955 | A | 7/1992 | Stern et al. |
| 5,296,044 | A | 3/1994 | Harvey et al. |
| 5,487,791 | A | 1/1996 | Everman et al. |
| 5,567,500 | A | 10/1996 | Marshall et al. |
| 5,647,916 | A | 7/1997 | Guazzoni |
| 5,789,060 | A | 8/1998 | Marshall et al. |
| 5,833,176 | A * | 11/1998 | Rubin .................... B64G 1/222 244/172.7 |
| 5,865,905 | A | 2/1999 | Clemens |
| 5,885,367 | A | 3/1999 | Brown et al. |
| 6,008,447 | A | 12/1999 | Meurer et al. |
| 6,091,016 | A * | 7/2000 | Kester .................... B64G 1/222 136/245 |
| 6,137,454 | A * | 10/2000 | Peck .................... H01Q 15/161 343/912 |
| 6,147,294 | A | 11/2000 | Dailey |
| 6,310,281 | B1 | 10/2001 | Wendt |
| 6,505,795 | B1 | 1/2003 | Thompson et al. |
| 6,547,190 | B1 | 4/2003 | Thompson et al. |
| 6,637,702 | B1 | 10/2003 | McCandless |
| 6,702,976 | B2 | 3/2004 | Sokolowski |
| 6,772,479 | B2 | 8/2004 | Hinkley et al. |
| 6,904,722 | B2 | 6/2005 | Brown et al. |
| 6,920,722 | B2 | 7/2005 | Brown et al. |
| 7,211,722 | B1 | 5/2007 | Murphy |
| 7,354,033 | B1 | 4/2008 | Murphey |
| 7,708,228 | B2 | 5/2010 | Chaix et al. |
| 7,710,348 | B2 | 5/2010 | Taylor |
| 7,806,370 | B2 | 10/2010 | Beidleman et al. |
| 7,895,795 | B1 | 3/2011 | Murphey et al. |
| 8,061,660 | B2 | 11/2011 | Beidleman et al. |
| 8,066,227 | B2 | 11/2011 | Keller et al. |
| 8,109,472 | B1 | 2/2012 | Keller et al. |
| 8,376,282 | B2 | 2/2013 | Keller et al. |
| 8,387,921 | B2 | 3/2013 | Taylor et al. |
| 8,393,581 | B2 | 3/2013 | Keller et al. |
| 8,616,502 | B1 | 12/2013 | Stribling et al. |
| 8,636,253 | B1 | 1/2014 | Spence et al. |
| 8,683,755 | B1 | 4/2014 | Spence et al. |
| 8,757,553 | B2 | 6/2014 | Legrand et al. |
| 8,757,554 | B1 | 6/2014 | Harvey et al. |
| 8,770,522 | B1 | 7/2014 | Murphey et al. |
| 8,816,187 | B1 * | 8/2014 | Stribling ................. H02S 30/20 136/245 |
| 8,893,442 | B1 | 11/2014 | Spence et al. |
| 8,894,017 | B1 | 11/2014 | Baghdasarian |
| 8,915,474 | B1 | 12/2014 | Baghdasarian et al. |
| 9,004,410 | B1 | 4/2015 | Steele et al. |
| 9,079,673 | B1 | 7/2015 | Steele |
| 9,120,583 | B1 | 9/2015 | Spence |
| 9,156,568 | B1 | 10/2015 | Spence et al. |
| 9,919,815 | B2 * | 3/2018 | Steele .................... B64G 1/443 |
| 10,059,471 | B2 * | 8/2018 | Steele ..................... B64G 1/44 |
| 2002/0040726 | A1 | 4/2002 | Roth et al. |
| 2002/0112417 | A1 | 8/2002 | Brown et al. |
| 2003/0000569 | A1 | 1/2003 | Zwanenburg |
| 2003/0047206 | A1 | 3/2003 | Kawam |
| 2003/0057329 | A1 * | 3/2003 | Thompson ............. B64G 1/443 244/172.7 |
| 2003/0164186 | A1 | 9/2003 | Clark |
| 2004/0016454 | A1 | 1/2004 | Murphy et al. |
| 2004/0194397 | A1 | 10/2004 | Brown et al. |
| 2005/0178921 | A1 | 8/2005 | Stribling et al. |
| 2006/0174930 | A1 | 8/2006 | Murphy et al. |
| 2007/0017566 | A1 | 1/2007 | Gaudiana et al. |
| 2007/0262204 | A1 | 11/2007 | Beidleman et al. |
| 2009/0078306 | A1 | 3/2009 | Nagengast et al. |
| 2009/0126775 | A1 | 5/2009 | White et al. |
| 2009/0184207 | A1 | 7/2009 | Warren et al. |
| 2010/0163684 | A1 | 7/2010 | Dando |
| 2010/0319270 | A1 | 12/2010 | Slade |
| 2011/0162690 | A1 | 7/2011 | Workman et al. |
| 2011/0192444 | A1 | 8/2011 | Beidleman et al. |
| 2011/0204186 | A1 | 8/2011 | Keller et al. |
| 2011/0210209 | A1 | 9/2011 | Taylor |
| 2011/0226897 | A1 | 9/2011 | Padavano |
| 2011/0253614 | A1 | 10/2011 | Curran et al. |
| 2011/0260936 | A1 * | 10/2011 | Leung ................. H01L 31/0525 343/720 |
| 2012/0012154 | A1 | 1/2012 | Keller |
| 2012/0025750 | A1 | 2/2012 | Margo |
| 2012/0090660 | A1 | 4/2012 | Keller et al. |
| 2012/0156824 | A1 * | 6/2012 | Streett .................... H01L 31/049 438/66 |
| 2012/0167943 | A1 * | 7/2012 | Blanchard ............... B64G 1/222 136/245 |
| 2012/0167944 | A1 | 7/2012 | Blanchard et al. |
| 2013/0061541 | A1 | 3/2013 | Taylor et al. |
| 2013/0112233 | A1 | 5/2013 | Coakley |
| 2013/0186011 | A1 | 7/2013 | Keller et al. |
| 2013/0193303 | A1 | 8/2013 | Smith |
| 2013/0276875 | A1 | 10/2013 | Carpenter |
| 2014/0042275 | A1 | 2/2014 | Abrams et al. |
| 2014/0123575 | A1 | 5/2014 | Bobbio |
| 2014/0150863 | A1 | 6/2014 | Spence et al. |
| 2014/0151485 | A1 | 6/2014 | Baudasse et al. |
| 2014/0230949 | A1 | 8/2014 | Daton-Lovett |
| 2014/0263844 | A1 | 9/2014 | Cook, Jr. |
| 2014/0326833 | A1 | 11/2014 | Spence et al. |
| 2015/0145724 | A1 | 5/2015 | Kana et al. |
| 2015/0162656 | A1 | 6/2015 | Fitz-Coy et al. |
| 2016/0024790 | A1 | 1/2016 | Baudasse |

OTHER PUBLICATIONS

EP Extended Search Report for Application No. 15167692.1-1754, dated Nov. 3, 2015 (6 pages).

Yee, et al., Carbon Fibre Reinforced Plastic Tape Springs. 45th AIAA/ASME/ASCE/AHS/ASC Structures, Structural Dynamics & Materials Conference 2004-1819.

* cited by examiner

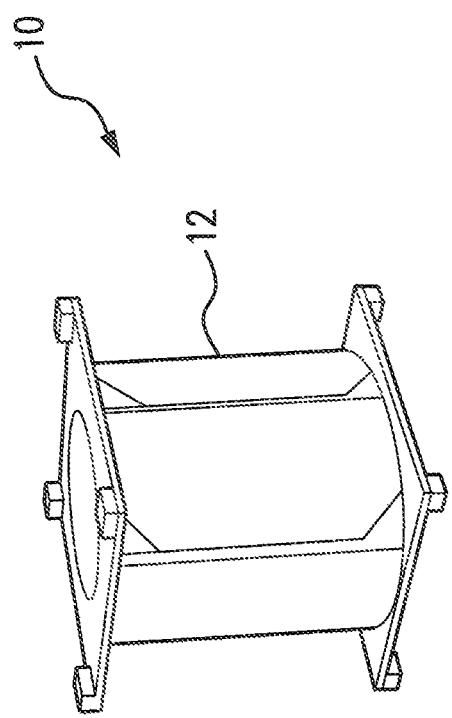
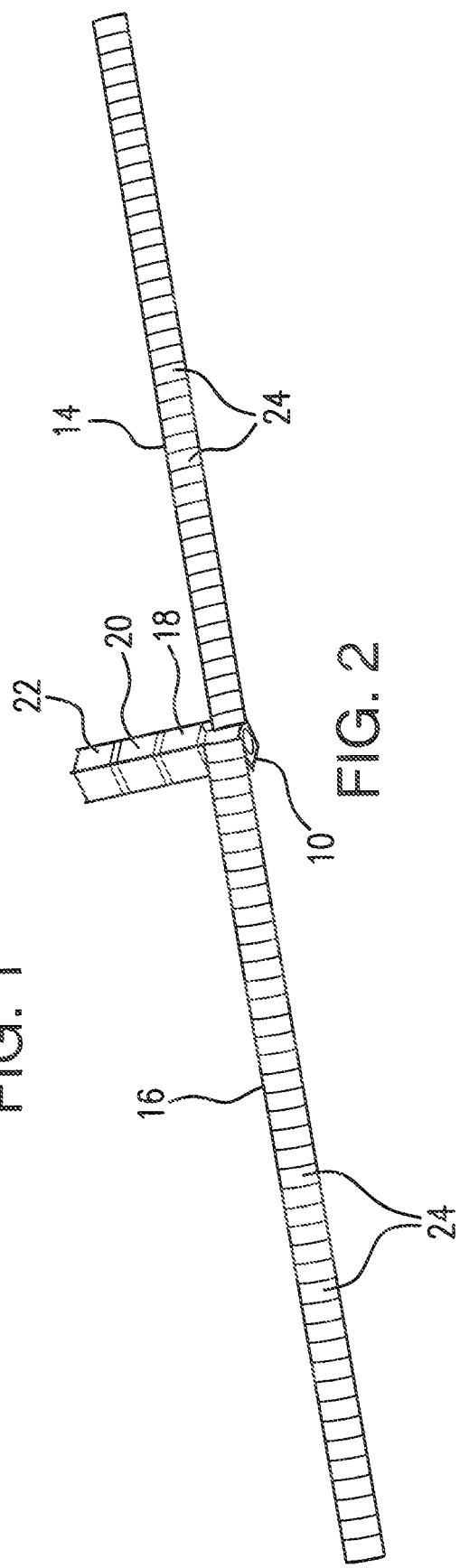
FIG. 1
FIG. 2

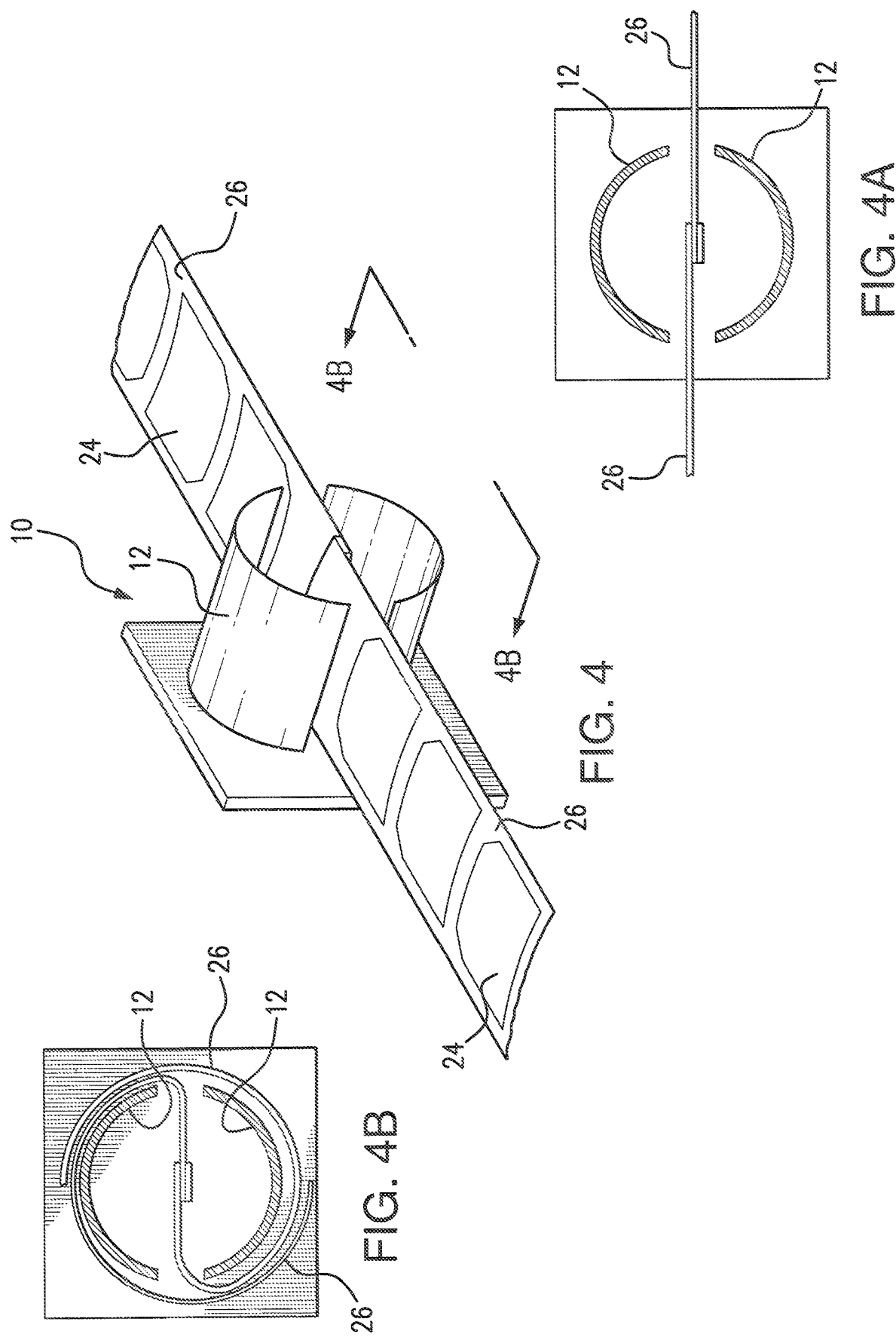

DEPLOYABLE SOLAR ARRAY FOR SMALL SPACECRAFT

REFERENCE TO RELATED APPLICATIONS

This application is a continuation of U.S. application Ser. No. 14/921,238, filed on Oct. 23, 2015, which claims the benefit of U.S. Provisional Application No. 62/068,501 filed Oct. 24, 2014, and U.S. Provisional Application No. 62/202,448 filed Aug. 7, 2015, the contents of which are incorporated herein by reference in their entirety.

This application is related to U.S. patent application Ser. No. 14/546,958, filed Nov. 18, 2014, now U.S. Pat. No. 9,004,410; and U.S. patent application Ser. No. 14/658,043, filed Mar. 13, 2015 now U.S. Pat. No. 9,079,673.

BACKGROUND OF THE DISCLOSURE

1. Field of the Disclosure

The present disclosure relates to assemblies for collecting electromagnetic energy.

2. Description of the Related Art

Solar photovoltaic arrays are commonly used to power spacecraft. Spacecraft needing high power generation typically use solar array wings that fold or roll-up for launch (because of the constraints of available volume within the launch vehicle), then unfold or unroll in space to present a large solar collection area as-needed to intercept sufficient sunlight to generate the required power. A common approach is to mount the solar cells onto rigid panels, accordion-fold the panels for stowage, and subsequently deploy them in space using hinges between the panels and a supplied deployment force. The common approach has limitations in how compactly the arrays can be packaged, because of the inherent volume and inflexibility of the rigid panels that are used as mounting substrates for the photovoltaic assemblies.

To overcome the packaging limitations of rigid panels, reduce mass, and reduce packaged volume, a Solar Cell Blanket is often used. A Solar Cell Blanket may comprise a thin, flexible assembly of solar cells, coverglass, interconnects, terminal strips, and insulating film that may be unsupported, instead of mounted on thick rigid panel structures. These thin flexible membranes are normally supplemented with a separate deployable super-structure or scaffold that provides the means to deploy the folded or rolled-up solar array into its final deployed configuration and to provide the structural rigidity to hold the deployed array, since the flexible membrane is not a rigid structure. The deployed super-structure is typically attached to an orientation device on a spacecraft so as to allow the solar array to be pointed towards the sun. The super-structure also allows the array to withstand the structural loads that may be placed on the deployed array during spacecraft operations, including loads from accelerations that occur during the spacecraft's operating life, including orbital and orientation maneuvers.

Prior methods to provide the super-structure for a flexible membrane deployable solar array typically use umbrella-like, or oriental-fan-like structures to deploy and maintain the structure of a circular solar array, or one or two deployable booms to deploy a rolled or folded rectangular array. The solar arrays found on the Space Station and on the Hubble telescope are examples of rectangular arrays that use a single deployable boom or a pair of deployable booms, respectively, to deploy a flexible solar array and provide deployed structural rigidity. Such flexible membrane solar arrays with discrete and separate super-structures are limited in the shielding provided to the backside of the solar array after deployment, and by the complexity of deploying such an array with tensioning interfaces between the deployable boom and the nonstructural solar array blanket.

CubeSats are a type of miniaturized satellites. Although there is a desire to provide power for CubeSats from solar panels, the known methods of providing solar arrays described above are difficult or impossible to apply to CubeSats because of the small size of the CubeSat and the limited space available on the CubeSat. Accordingly, there is a need for an improved system that overcomes these and other limitations.

SUMMARY

In one aspect, the present disclosure describes a deployable solar array comprising: an array of electromagnetic transducer devices; and a flexible, elongated, rectangular sheet for supporting the array of electromagnetic transducer devices composed of a composite laminate having a predetermined pattern of graphite fiber plies which impart a predefined tension in the planar surface of the sheet so that it curls into a planar sheet with a uniform radius of curvature along its major axis.

In some implementations, the array of electromagnetic transducer devices includes an array of photovoltaic devices. In some instances, the array of electromagnetic transducer devices includes an array of semiconductor sensors. In some cases, the array of electromagnetic transducer devices includes an array of antennas.

In some implementations, the pattern of graphite fiber plies consists of at least intermediate modulus 7 (IM7) plies oriented at least 30° apart from each other.

In some implementations, the graphite fiber plies gives the sheet a strength of up to 0.28 g, a capability of handling stress when deployed at a vibration frequency of up to 0.9 Hz, and a stability of up to 1 milli-g under deployed flight loading.

In some implementations, the sheet is wound on a spool in a stowed configuration, and forms into a planar sheet having a uniform curvature as it unwinds from the spool upon deployment.

In some implementations, the radius of the curvature of the sheet may be selected by those skilled in the art to meet application requirements.

In some implementations, the sheet has a width of less than 100 mm and a length after full deployment that may be selected by those skilled in the art to meet application requirements.

In some implementations, the solar cells are mounted on a polyimide carrier and the polyimide carrier is bonded to the composite laminate.

In some implementations, the flexible sheet has a thickness of between 0.1 mm and 0.3 mm.

In some implementations, the array of photovoltaic devices includes a first module having a first side dimension, and a second module having a second side dimension different from the first side dimension, each module including a plurality of discrete solar cells connected in a serial or parallel electrical configuration.

In some implementations, the array of photovoltaic devices includes an array of coverglass-interconnected-solar cells (CICs) mounted on the polyimide carrier by a pressure sensitive adhesive.

In another aspect, the present disclosure describes a method of deploying a solar array in space comprising: providing a flexible, elongated, rectangular sheet for supporting a plurality of solar cell assemblies; supporting the rectangular sheet in a spool under compression on a mandrel in a stowed configuration; and releasing the sheet from the mandrel during a deployment operation so that the sheet automatically deploys from the mandrel.

In another aspect, the present disclosure describes a small spacecraft with deployable solar array for providing less than 50 watts of power comprising: first and a second flexible, elongated, rectangular sheets for supporting a string of solar cell assemblies connected in a serial and/or parallel electrical configuration; a mandrel in the spacecraft configured for supporting the first and second rectangular sheets in a stowed configuration in the spacecraft in which the sheets are coiled under compressive force; and a deployment aperture on the spacecraft for enabling the automatic unwinding of the sheets from the mandrel during a deployment operation so that the first sheet is deployed in a first direction from the spacecraft and the second sheet is deployed in the same plane as the first sheet but in an opposite direction from the spacecraft.

In some implementations, each sheet is a composite laminate composed of a pattern of graphite fiber plies.

In some implementations, each sheet forms into a planar sheet having a uniform curvature as it unwinds from the mandrel.

In some implementations, the radius of the curvature of the sheet may be selected by those skilled in the art to meet application requirements.

In some implementations, each sheet has a width of less than 100 mm and a length after full deployment that may be selected by those skilled in the art to meet application requirements.

In some implementations, the solar cells are mounted on a polyimide carrier and the polyimide carrier is bonded to the composite laminate.

In some implementations, each flexible sheet has a thickness of between 0.1 mm and 0.3 mm.

In some implementations, the mandrel is disposed within a one unit CubeSat housing.

In some implementations, the solar cell assemblies are cover glass-interconnected-solar cells (CICs).

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

To complete the description and in order to provide for a better understanding of the disclosure, a set of drawings is provided. The drawings form an integral part of the description and illustrate embodiments of the disclosure, which should not be interpreted as restricting the scope of the disclosure, but just as examples of how the disclosure can be carried out. The drawings comprise the following figures:

FIG. 1 is an illustration of an exemplary CubeSat having a spool for storing one or more solar cell arrays;

FIG. 2 is an illustration of the exemplary CubeSat of FIG. 1 attached to three additional CubeSats and having the solar cell arrays in a deployed state;

FIG. 4 is another view of the exemplary CubeSat of FIG. 1 having the solar cell arrays in a deployed state.

FIG. 4A is a view through the B:B plane of FIG. 4 showing the solar cell arrays in a deployed state.

FIG. 4B is a view through the B:B plane of FIG. 4 showing the solar cell arrays in a towed state.

DESCRIPTION OF ILLUSTRATIVE EMBODIMENTS

Figure 3:
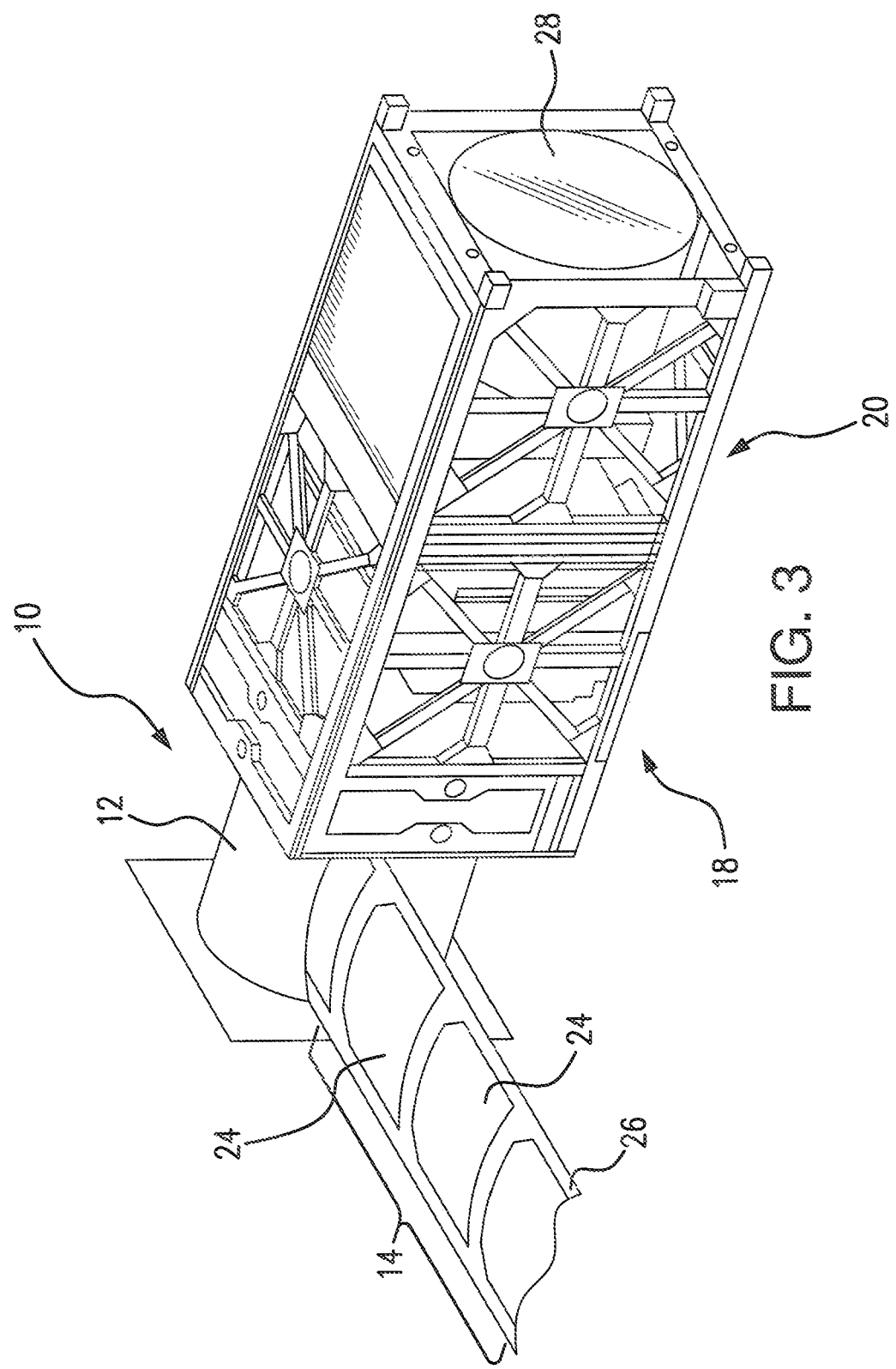
FIG. 3 is an illustration of the exemplary CubeSat of FIG. 1 attached to two additional CubeSats and having the solar cell array in a deployed state.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

As shown with respect to FIGS. 1 and 2 a small spacecraft such as a CubeSat 10 has a mandrel (e.g., a spool) 12 for storing one or more deployable arrays 14, 16 of electromagnetic transducer devices 24 such as photovoltaic devices. As mentioned above, a CubeSat is a type of miniaturized satellite. A typical CubeSat is a 10 cm×10 cm×10 cm cube, thus having a volume of one liter; other dimensions are possible as well. In some cases, CubeSats can be attached to one another in strings or blocks to provide functionalities and capabilities that would not otherwise be practically available in a single CubeSat. For example, one CubeSat can be used as a power source to supply power necessary for other attached CubeSats to perform their functions.

Although in the illustrated example the electromagnetic transducer devices 24 are photovoltaic devices, in some implementations, the electromagnetic transducer devices 24 can be other types of semiconductor sensors. Further, in some cases, the electromagnetic transducer devices 24 can be antennas. Thus, depending on the implementation, each array 14, 16 of electromagnetic transducer devices 24 can include a semiconductor sensor array, an array of photovoltaic devices or an antenna array.

The arrays 14, 16 can be used, for example, as a power source to supply power to one or more additional CubeSats 18, 20, 22 attached to the CubeSat 10. For example, in some implementations, each array(s) 14, 16 is suitable for providing a small amount of power (e.g., less than 50 watts). In the illustrated example, the photovoltaic devices 24 are solar cells. In some instances, each array 14, 16 of photovoltaic devices 24 includes a first module having a first side dimension, and a second module having a second side dimension different from the first side dimension. Each module can include, for example, a plurality of discrete solar cells connected in a serial or parallel configuration. In some implementations, each array 14, 16 of photovoltaic devices 24 includes an array of coverglass-interconnected-solar cells (CICs) mounted on the polyimide carrier by a pressure sensitive adhesive.

Figure 3A:
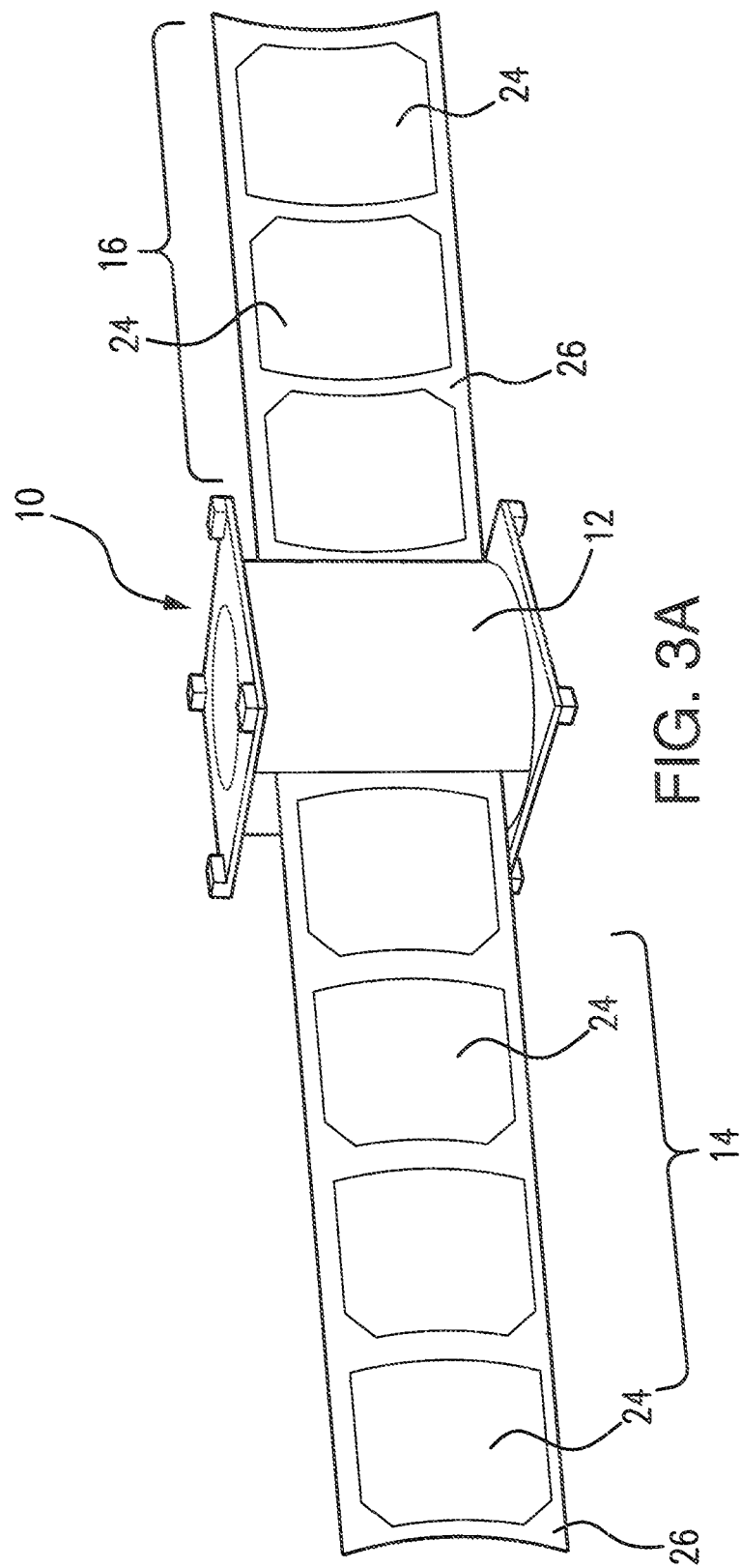
FIG. 3A is a is an illustration of the exemplary CubeSat of FIG. 1 having the solar cell arrays in a deployed state.

As shown in FIGS. 3 and 3A, the photovoltaic devices 24 of each array 14, 16 can be supported, for example, by a respective flexible, elongated, rectangular sheet 26 composed of a composite laminate having a predetermined pattern of graphite fiber plies which impart a predefined tension in the planar surface of the sheet so that it curls into a curvilinear sheet having a uniform radius of curvature along its major axis. For example, in some implementations, the pattern of graphite fiber plies consists of at least intermediate modulus 7 (IM7) plies oriented at least 30° apart from each other. In some instances, the graphite fiber plies give the sheet 26 a strength of up to 0.28 g, a capability of handling stress when deployed at a vibration frequency of up to 0.9 Hz, and a stability of up to 1 milli-g under deployed flight loading. In some instances, each sheet 26 has a width of less than 100 mm. The foregoing dimension may differ for other implementations.

In combination, the solar cells 24 and the flexible sheet 26 on which they are mounted form a solar cell assembly. In some cases, the solar cells 24 are mounted indirectly on the sheet 26. For example, the solar cells 24 can be mounted on a polyimide carrier, which is bonded to the composite laminate sheet 26. The flexible sheet 26 can have a thickness, for example, of between 0.1 mm and 0.3 mm. Further, the solar cell assemblies can have a side length such that when mounted on the polyimide carrier and wrapped around the spool 12 in the stowed configuration, the solar cell assemblies bend no more than a small amount out of plane. The foregoing dimensions may differ for other implementations.

In the illustrated example, the mandrel (e.g., spool) 12 for supporting the sheets 26 is disposed within a one unit CubeSat housing 30. The sheets 26 can be arranged in a deployed configuration (as shown, e.g., in FIGS. 2, 3, 3A, 4 and 4A), or in a stowed configuration (as shown, e.g., in FIG. 4B). In the stowed configuration, the sheets 26 are coiled or wound about the spool 12 under compressive force. In particular, in the stowed configuration, each sheet 26 can be circumferentially wound to form a spool configuration in a stationary position (see FIG. 4B). Upon deployment to the deployed configuration, as each sheet 26 unwinds from the spool configuration, the sheet 26 forms into a planar cylindrical portion sheet having a uniform cross-sectional curvature. In some implementations, the substrate is adapted to store strain energy when elastically deformed, and the assembly can transition from the stowed configuration to the deployed configuration using the stored strain energy. Thus, each sheet 26 can be released from the stowed configuration (FIG. 4B) by releasing the spool 12 to allow it to rotate during a deployment operation so that the sheet automatically deploys from the spool (FIG. 4A). As the sheet 26 unwinds from the spool 12, the sheet 26 forms a substantially planar sheet having a uniform curvature. The CubeSat 10 can include one or more deployment apertures for enabling the automatic unwinding of the sheets 26 from the spool 12 during the deployment operation so that a first sheet 26 is deployed in a first direction from the CubeSat and a second sheet 26 is deployed in the same plane as the first sheet but in an opposite direction from the CubeSat.

As mentioned above, in some instances, the CubeSat 10 is attached to one or more additional CubeSats. As shown, for example in FIG. 3 a string of three CubeSats includes the CubeSat 10 of FIG. 1 having a solar cell array 14 in a deployed state and being attached to a second CubeSat 18 and a third CubeSat 20. The third CubeSat 20 can include a lens 28 on its exposed surface.

It is to be noted that the terms "front," "back," "top," "bottom," "over," "on," "under," and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Furthermore, those skilled in the art will recognize that boundaries between the above described units/operations are merely illustrative. The multiple units/operations may be combined into a single unit/operation, a single unit/operation may be distributed in additional units/operations, and units/operations may be operated at least partially overlapping in time. Moreover, alternative embodiments may include multiple instances of a particular unit/operation, and the order of operations may be altered in various other embodiments.

In the claims, the word 'comprising' or 'having' does not exclude the presence of other elements or steps than those listed in a claims. The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The present disclosure can be embodied in various ways. The above described orders of the steps for the methods are only intended to be illustrative, and the steps of the methods of the present disclosure are not limited to the above specifically described orders unless otherwise specifically stated. Note that the embodiments of the present disclosure can be freely combined with each other without departing from the spirit and scope of the disclosure.

Although some specific embodiments of the present disclosure have been described in detail with examples, it should be understood by a person skilled in the art that the above examples are only intended to be illustrative but not to limit the scope of the present disclosure. The above embodiments can be modified without departing from the scope and spirit of the present disclosure which are to be defined by the attached claims. Accordingly, other implementations are within the scope of the claims.

What is claimed is:
1. A spacecraft comprising:
a housing having deployment apertures;
a spool disposed within the housing;
first and second deployable arrays, each of the deployable arrays including:

an array of photovoltaic devices, each of which has a backside surface mounted on a polyimide carrier; and a flexible sheet for supporting the array of photovoltaic devices, wherein each of the sheets is composed, respectively, of a composite laminate to which the polyimide carrier is bonded, wherein the spool is operable to support the sheet of each of the deployable arrays in a stowed configuration in which the sheets are coiled under compressive force, wherein, in the stowed configuration, each of the sheets is wound about the spool, and wherein each respective sheet is operable to curl into a curvilinear sheet when the sheet is unwound from the stowed configuration, wherein a respective end of a first one of the sheets directly contacts and overlaps a respective end of a second one of the sheets in the stowed configuration and in a deployed configuration; and a structure operable to enable automatic unwinding of the sheets from the spool during a deployment operation so that the sheet of the first deployable solar array is deployed through a first one of the deployment apertures in a first direction from the spacecraft and the sheet of the second deployable solar array is deployed through a second one of the deployment apertures in a same plane as the sheet of the first deployable solar array but in an opposite direction from the spacecraft.

2. The spacecraft of claim 1 wherein each of the deployable arrays comprises a string of solar cell assemblies connected in at least one of a serial or parallel electrical configuration.

3. The spacecraft of claim 1 wherein the spool is disposed within a one unit CubeSat housing.

4. The spacecraft of claim 1 wherein each of the sheets is operable to form into a respective planar sheet having a uniform curvature as the sheet unwinds from the support.

5. The spacecraft of claim 1 wherein each of the sheets has a width of less than 100 mm.

6. The spacecraft of claim 1 wherein each of the sheets has a thickness of between 0.1 mm and 0.3 mm.

7. The spacecraft of claim 1 wherein each of the sheets is composed, respectively, of a composite laminate that includes a pattern of plies which impart a tension to the surface of the sheet so that the sheet curls into a curvilinear sheet when the sheet is unwound from the stowed configuration.

8. The spacecraft of claim 7 wherein the composite laminate comprises graphite fiber plies.

9. The spacecraft of claim 1 wherein each of the sheets is a single rectangular sheet.

10. A method of deploying the spacecraft of claim 1 in space, the method comprising:
providing the spacecraft of claim 9;
supporting the sheets
under compression in the stowed configuration; and
releasing the sheets from the stowed configuration during a deployment operation so that the sheets automatically deploy.

11. The method of claim 10 wherein the sheet of the first deployable solar array is deployed through the first one of the deployment apertures in the first direction from the spacecraft, and the sheet of the second deployable solar array is deployed through the second one of the deployment apertures in the same plane as the sheet of the first deployable solar array but in the opposite direction from the spacecraft.

* * * * *